United States Patent
Ohno et al.

(10) Patent No.: US 6,476,411 B1
(45) Date of Patent: Nov. 5, 2002

(54) INTERSUBBAND LIGHT EMITTING ELEMENT

(75) Inventors: Hideo Ohno, Sendai (JP); Keita Ohtani, Sendai (JP)

(73) Assignee: Tohoku University, Miyagi (JP)

(*) Notice: Subject to any disclaimer, the term of this patent is extended or adjusted under 35 U.S.C. 154(b) by 92 days.

(21) Appl. No.: 09/649,515

(22) Filed: Aug. 29, 2000

(30) Foreign Application Priority Data

Sep. 3, 1999 (JP) .......................... 11-250702
Mar. 6, 2000 (JP) .......................... 2000-060542

(51) Int. Cl.$^7$ ............................................. H01L 29/06
(52) U.S. Cl. ........................ 257/15; 257/18; 257/22; 257/97; 438/20; 438/22; 438/24; 372/44; 372/45
(58) Field of Search ............................ 257/15, 18, 22, 257/97; 372/44, 45; 438/22, 20, 24, 28, 46, 47

(56) References Cited

U.S. PATENT DOCUMENTS 5,588,015 A * 12/1996 Yang ........................... 372/45
5,799,026 A * 8/1998 Meyer et al. ................. 372/45

OTHER PUBLICATIONS

Mayer et al., "Type–II and type–I interband cascade lasers", Electronics Letters, Jan. 1996, vol. 32 (1), pp 45–46.*

* cited by examiner

Primary Examiner—Steven Loke
Assistant Examiner—Donghee Kang
(74) Attorney, Agent, or Firm—Oliff & Berridge PLC (57) ABSTRACT

An intersubband light emitting element includes a semiconducting substrate, a first layer composed of a first semiconducting material, and a second layer composed of second semiconducting material. The first layer makes a heterojunction with the second layer. The top of a valence band of the first semiconducting material is higher in energy than the bottom of a conduction band of the second semiconducting material. The element further includes a third layer making a heterojunction with the first or second layer. The third layer has a superlattice structure. One of the first and second layer is provided on the semiconducting substrate directly or through at least one semiconducting layer.

12 Claims, 8 Drawing Sheets

INTERSUBBAND LIGHT EMITTING ELEMENT

BACKGROUND OF THE INVENTION

1. Field of the Invention

The present invention relates to an intersubband light emitting element such as a light emitting diode and a laser diode. Such an element emits light of which a wavelength ranges from a near infrared region to a terahertz region.

2. Description of the Related Art

The intersubband light emitting element is attractive as a light source for emitting light having a wavelength that ranges from the near infrared region to the terahertz (THz) region, because it has a relatively high oscillator strength and is capable of controlling a transition wavelength of the light widely utilizing the structure of the element. A conventional intersubband light emitting element has a heterojunction structure referred as a type-I structure, such as GaAs/AlGaAs and GaInAs/AlInAs.

However, the element of the type-I structure has a disadvantage that the amount of carrier leakage is high and thus the injection efficiency of the carriers is low when the carriers are injected into a quantum well of the element. This is one of the reasons why, under existing circumstances, the threshold current density of the element increases during the laser oscillation, and makes it difficult to oscillate the element continuously under a room temperature condition.

DISCLOSURE OF THE INVENTION

It is an object of the present invention to provide an intersubband light emitting element with a minimized leakage current and a decreased threshold current.

It is another object of the present invention to provide an intersubband light emitting element with a minimized leakage current and a decreased threshold current, that is capable of emitting light having a wavelength of the THz region.

It is another object of the present invention to provide an intersubband light emitting element with a minimized leakage current and a decreased threshold current, that is capable of emitting light having a plurality of predetermined wavelengths such as blue light and red light at the same time.

According to one aspect of the present invention, there is provided an intersubband light emitting element comprising:

a semiconducting substrate;

a first layer composed of a first semiconducting material;

a second layer composed of a second semiconducting material and making a heterojunction with the first layer, the top of a valence band of the second semiconducting material being higher in energy than the bottom of a conduction band of the first semiconducting material; and a third layer making a heterojunction with one of the first and second layer and having a superlattice structure, wherein one of the first and second layer is provided on the semiconducting substrate directly or through at least one semiconducting layer.

Intersubband light emission occurs when carriers injected into the second subband within a quantum well of the first layer are relaxed to the first subband within the same quantum well. In order that the intersubband light emission takes place effectively, it is necessary to prevent leakage of the injected carrier and thereby utilize the intersubband transitions of the entire carriers.

With the above-mentioned element according to the invention, the first layer and the second layer form a broken gap structure, and this structure prevents leakage of the carriers or electrons, with the result that the threshold current of the element is decreased.

The third layer having the superlattice structure forms a new energy gap. Consequently, the leakage current is further reduced and the threshold current is also further decreased.

The element according to the present invention may be constituted such that the functions of the first and the second layers are reversed to each other. In this instance, the intersubband light emission occurs when carriers injected into the second subband within a quantum well of the second layer are relaxed to the first subband within the same quantum well. The carriers are then pulled from the first subband rapidly due to an interband tunneling effect of the heterojunction structure formed with the first layer and the second layer. Similarly, the broken gap structure prevents the leakage of the carriers or holes, and the leakage current is further reduced because the third layer having the superlattice structure makes a heterojunction with the first layer.

Preferably, the element comprises a plurality of sets of the first and second layers, the sets each having a quantum well width of one of the first and second layers, the quantum well widths being different from each other among the sets. The wavelength of the light emitted from the element or a light emitting portion formed with the quantum well becomes longer as the well width becomes wider, and it is thus possible to emit the light having a plurality of predetermined wavelengths such as blue light and red light at the same time.

By way of a concrete example, the first semiconducting material is one of InAs and InAs with an impurity, the second semiconducting material is one of GaSb and GaSb with an impurity, and the superlattice structure is one of an InAs/AlSb superlattice structure, an InAs/AlSb superlattice structure with an impurity, a GaSb/AlGaSb superlattice structure, a GaSb/AlGaSb superlattice structure with an impurity, a GaSb/AlSb superlattice structure, and a GaSb/AlSb superlattice structure with an impurity. The impurity of the InAs is one of Al and Ga instead of one of In and Si, one of Sb and P instead of As and so on. The impurity of GaSb is one of In and Al instead of one of Ga, Si and Be, one of As and P instead of Sb.

According to another aspect of the present invention, there is provided an intersubband light emitting element comprising:

a semiconducting substrate;

a first layer composed of a first semiconducting material;

a second layer composed of a second semiconducting material and making a heterojunction with the first layer, the bottom of a conduction band of the second semiconducting material being higher in energy than that of the first semiconducting material or the top of a valence band of the second semiconducting material being a lower in energy than that of the first semiconducting material;

a third layer composed of a third semiconducting material which is same as the first semiconducting material and making a heterojunction with the first layer; and a forth layer composed of a forth semiconducting material and making a heterojunction with the third layer, the top of a valence band of the forth semiconducting material being a higher in energy than the bottom of a conduction band of the second semiconducting material or the bottom of a conduction band of the forth semiconducting material being a lower in energy than the top of a valence band of the second semiconducting material;

wherein one of the first and forth layer is provided on the semiconducting substrate directly or through at least one semiconducting layer.

When widening the well width of the quantum well to prolong the wavelength of the emitting light to the THz region, the second subband within the quantum well becomes lower than the top of a valence band of the third layer. Therefore, the carriers injected into the second subband are not blocked by the barrier and thus the injection efficiency of the carriers decreases.

With the above-mentioned element according to the invention, the quantum well is formed with the first to third layers. In this case, in order to prevent the decrease of the injection efficiency due to the prolongation of the wavelength to the THz region, a projecting potential barrier is formed at the center of the quantum well by the second layer of which the bottom of a conduction band is higher in energy than that of the first layer. Such a projecting potential barrier has an effect on only the carrier distributed around the center of the quantum well. Accordingly, it is possible to increase the energy of the first subband without changing the energy of the second subband. Thereby, it is possible to decrease an energy space of the subband without affecting the injection efficiency of the carriers. As a result, it is possible to realize the element with a high efficiency even if the light having the wavelength of the THz region is emitted.

The element according to the present invention may be constituted such that functions of the first and the third layers are reversed to each other. In this instance, the intersubband light emission occurs when carriers injected into second subband within a quantum well of the second layer are relaxed to first subband within the same quantum well.

Preferably, the element comprises a plurality of sets of the first to forth layers, the sets each having a potential barrier of the second layer, heights of the potential barriers being different from each other among the sets. In this way, the element capable of emitting the light with a plurality of wavelengths can be achieved. The reason is that the injection into the second subband can be performed with the same efficiency because the energy of the second subband does not substantially change even if the height of the potential barrier changes, and no carrier always exists at the first subband because the interband tunnel effect of the heterojunction structure formed with the first and second layers is remarkable and thus reabsorption of the carriers hardly occurs.

By way of a concrete example, the first semiconducting material is one of InAs and InAs with an impurity, the second semiconducting material is one of AlInAs, AlInAs with an impurity, GaInAs, GaInAs with an impurity, InAsSb, InAsSb with an impurity, AlGaSb and AlGaSb with an impurity, the third semiconducting material is one of GaSb and GaSb with an impurity.

By further comprising a fifth layer with a superlattice structure, a new energy gap is formed. As a result, the leakage current is further reduced and the threshold current is further decreased. The superlattice structure is one of an InAs/AlSb superlattice structure, an InAs/AlSb superlattice structure with an impurity, a GaSb/AlGaSb superlattice structure, a GaSb/AlGaSb superlattice structure with an impurity, a GaSb/AlSb superlattice structure, and a GaSb/AlSb superlattice structure with an impurity.

BRIEF DESCRIPTION OF THE DRAWINGS

Embodiments of the intersubband light emitting element according to the present invention will be explained below with reference to the accompanying drawings.

DESCRIPTION OF THE PREFERRED EMBODIMENTS

Figure 1:
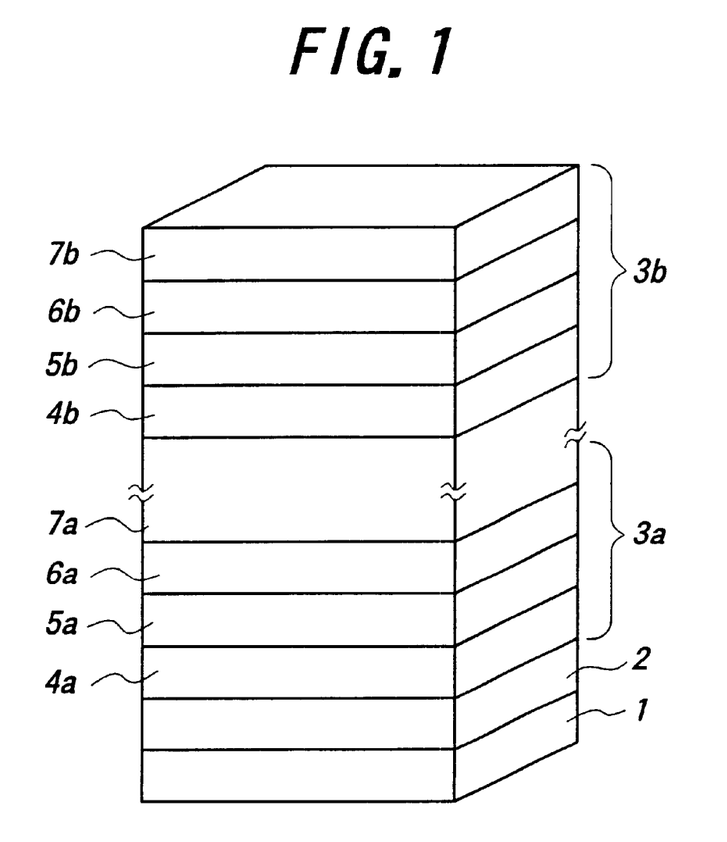
FIG. 1 is a schematic diagram showing a first embodiment of the element according to the present invention.

FIG. 1 is a schematic diagram showing a first embodiment of the element according to the present invention. The element comprises an InAs substrate 1, an InAs/AlSb layer 2 provided on the InAs substrate 1 and having a superlattice structure, and a plurality of layered portions 3a, 3b provided on the InAs/AlSb layer 2 successively.

The layered portion 3a or 3b has an AlSb layer 4a or 4b, an InAs layers 5a or 5b as the first layer, a GaSb layer 6a or 6b as the second layer making a heterojunction with the InAs layer 5a or 5b, and an InAs/AlSb layer 7a or 7b as the third layer having the superlattice structure. In the embodiment, quantum well width of the InAs layer 5a is different from that of the InAs layer 5b. Thereby, it is possible to emit the light having a plurality of wavelengths. The well width can be changed by changing the thickness of the InAs layer 5a or 5b, for example.

Figure 2:
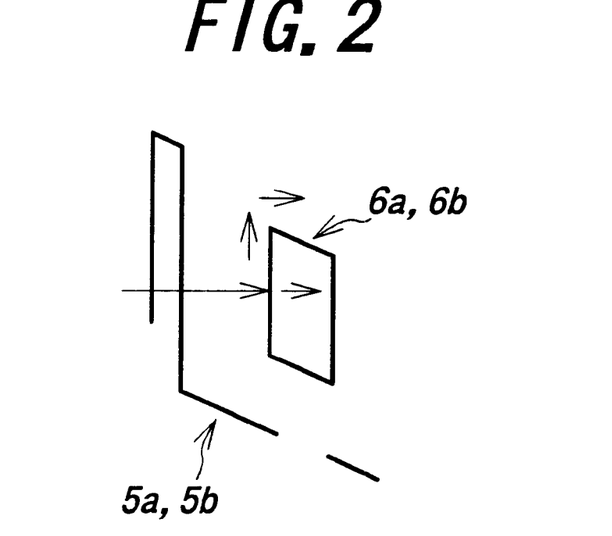
FIG. 2 is a schematic diagram showing the energy levels of an InAs layer and a GaSb layer.

The operation of the embodiment will be explained. As the top of a valence band of GaSb is higher in energy than the bottom of a conduction band of InAs, InAs layers 5a, 5b and GaSb layers 6a, 6b have a broken gap structure as shown in FIG. 2. As carriers or electrons injected into second subband within a quantum well of the InAs layers 5a, 5b are blocked by a bandgap of the respective GaSb layers 6a, 6b as represented by arrow, it is possible to prevent leakage of the carriers. As a result of this, the leakage current of the element is reduced and the injection of the carriers with high efficiency is possible.

Figure 3:
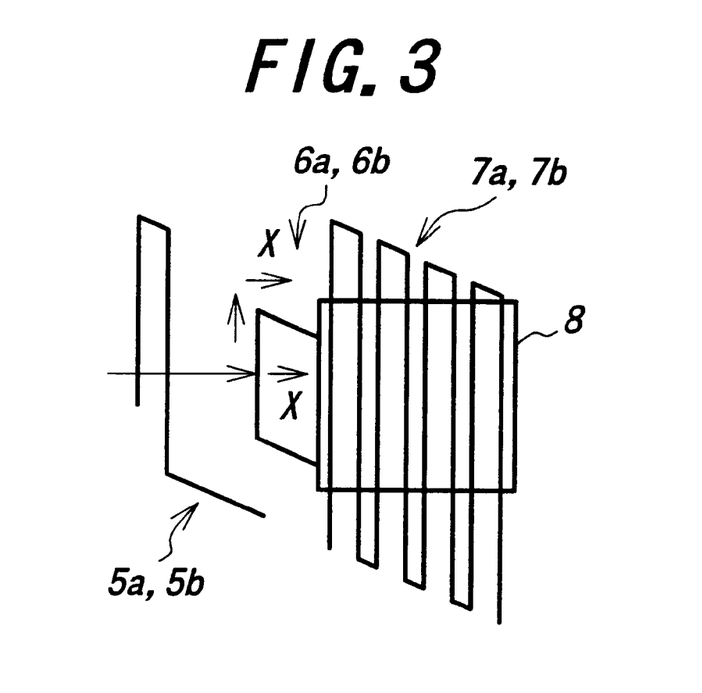
FIG. 3 is a schematic diagram showing the energy levels of an InAs layer, a GaSb layer an InAs/AlSb layer.

In the embodiment, as shown in FIG. 3, the leakage current is further reduced and the efficiency of the injection is improved because there is the InAs/AlSb layer 7a, 7b with the superlattice which comprises a forbidden band 8.

Figure 4:
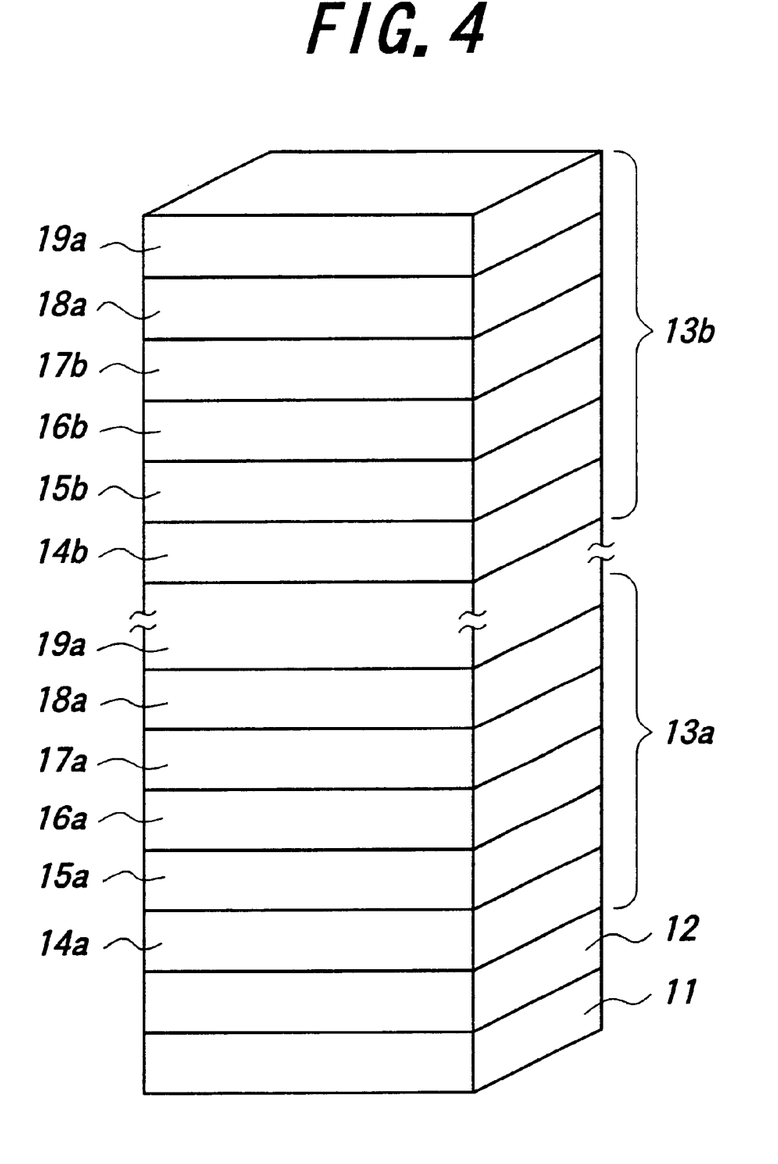
FIG. 4 is a schematic diagram showing a second embodiment of the element according to the present invention.

FIG. 4 is a schematic diagram showing a second embodiment of the element according to the present invention. The element comprises an InAs substrate 11, an InAs/AlSb layer 12 provided on the InAs substrate 11 and having a superlattice structure, and a plurality of layered portions 13a, 13b provided on the InAs/AlSb layer 2 successively.

The layered portion 13a or 13b has an AlSb layer 14a or 14b, an InAs layers 15a or 15b as the first layer, an AlInAs layer 16a or 16b as the second layer making a heterojunction with the InAs layer 15a or 15b, an InAs layer 17a or 17b as the third layer making a heterojunction with the AlInAs layer 16a or 16b, a GaSb layer 18a or 18b as the forth layer making a heterojunction with the InAs layer 17a or 17b, and an InAs/AlSb layer 19a or 19b as the fifth layer having the superlattice structure.

The InAs layers 15a, 15b, the AlInAs layers 16a, 16b and the InAs layers 17a, 17b form quantum wells (light emitting portion), respectively. A height of projecting potential barriers formed with the AlInAs layer 16a are different from that formed with the AlInAs layer 16b and thus it is possible to emit light having a plurality of wavelengths. The heights of the potential barriers can be changed by changing the composition of material of the layer forming the potential barrier, for example. In this case, the heights can be changed by changing the Al composition of the AlInAs.

Figure 5A:
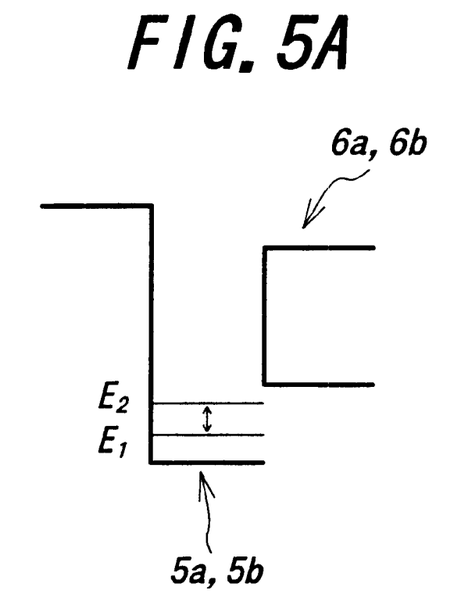
FIG. 5A is a schematic diagram showing the energy levels of an InAs layer and a GaSb layer as shown in FIG. 1.

The operation of the embodiment will be explained. The intersubband light emission occurs when the carriers injected into second subband $E_2$ within a quantum well are relaxed to first subband $E_1$. If a well width of a quantum well of the element having a InAs/GaSb/AlSb heterojunction structure as shown in FIG. 1 is widened to prolong the wavelength to the THz region, the second subband is lower in energy than the top of a valence band of the GaSb as shown in FIG. 5A. Therefore, the carrier injected into the second subband are not blocked by the barrier and thus the efficiency of the carrier injection is decreased.

Figure 5B:
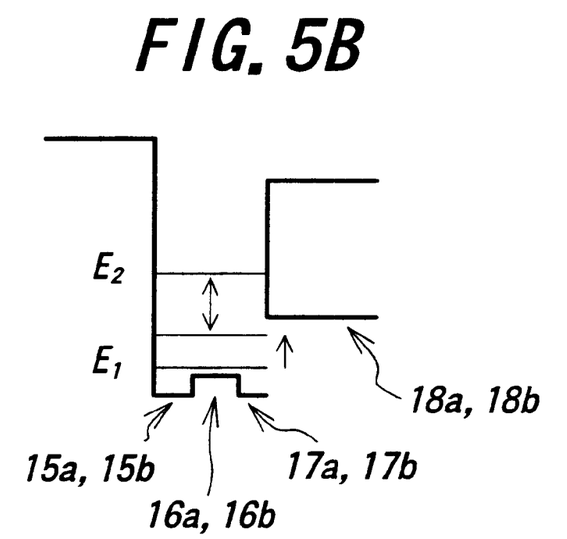
FIG. 5B is a schematic diagram showing energy levels of an InAs layer, an AlInAs layer, an InAs layer and a GaSb layer as shown in FIG. 2.

According to the embodiment, in order to prevent the decrease of the injection efficiency due to the prolongation of the wavelength to the THz region, a projecting potential barrier is formed at the center of the quantum well by the AlInAs having the top of a conduction band higher in energy than that of the InAs and lower in energy than the top of a valence band of the GaSb as shown in FIG. 5B. Such a projecting potential barrier has an effect on only the carrier distributed at the center of the quantum well. Accordingly, it is possible to increase the energy of the first subband without changing the energy of the second subband. Thereby, it is possible to decrease the energy space of the subband without affecting the injection efficiency of the carriers. As a result, it is possible to realize the element with a high efficiency even if the light having the wavelength of the THz region is emitted.

Figure 6:
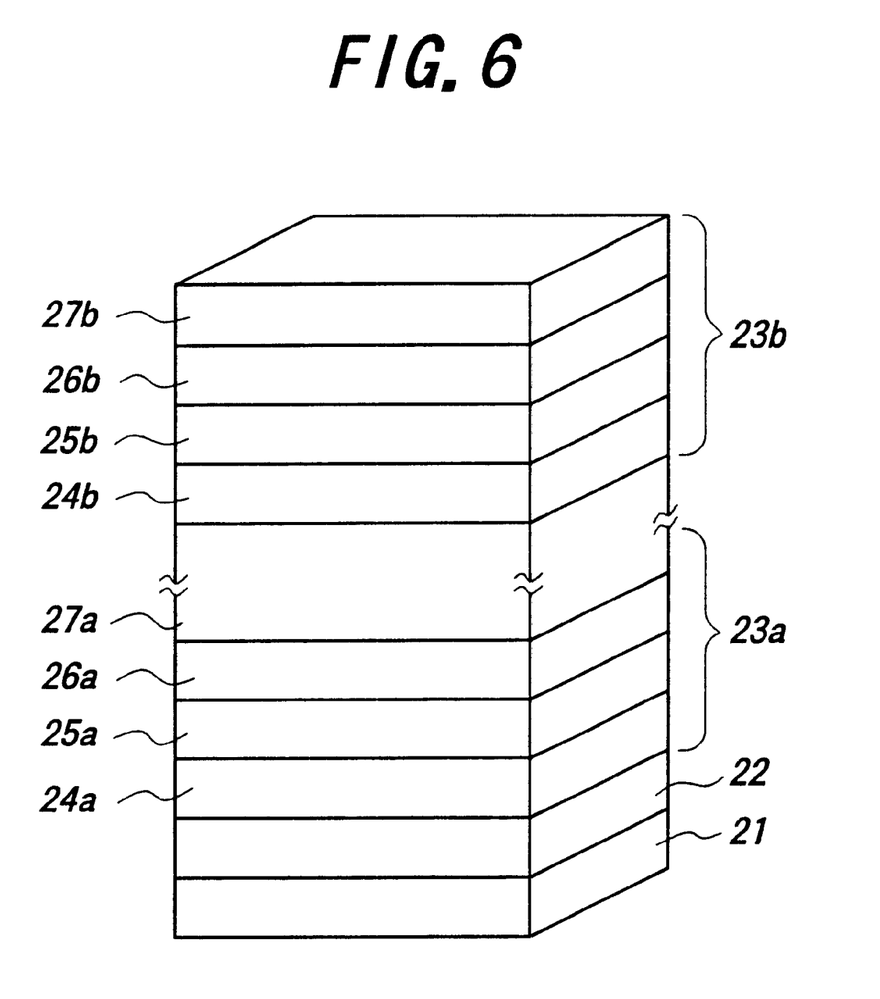
FIG. 6 is a schematic diagram showing a third embodiment of the element according to the present invention.

FIG. 6 is a schematic diagram showing a third embodiment of the element according to the present invention. The element performs an intersubband light emission at a valence band of itself and comprises a GaSb substrate 21, a GaSb/AlGaSb or GaSb/AlSb layer 22 provided on the GaSb substrate 21 and having a superlattice structure, and a plurality of layered portions 23a, 23b provided on the GaSb/AlGaSb or GaSb/AlSb layer 22 successively.

The layered portion 23a or 23b has an AlSb layer 24a or 24b, a GaSb layers 25a or 25b as the first layer, an InAs layer 26a or 26b as the second layer making a heterojunction with the GaSb layer 25a or 25b, and a GaSb/AlGaSb layer 27a or 27b as the third layer having the superlattice structure. In the embodiment, a quantum well widths of the GaSb layer 25a is different from that of GaSb layer 25b. Thereby, it is possible to emit the light having a plurality of wavelengths. The well width can be changed by changing the thickness of the GaSb layer 25a or 25b, for example.

Figure 7:
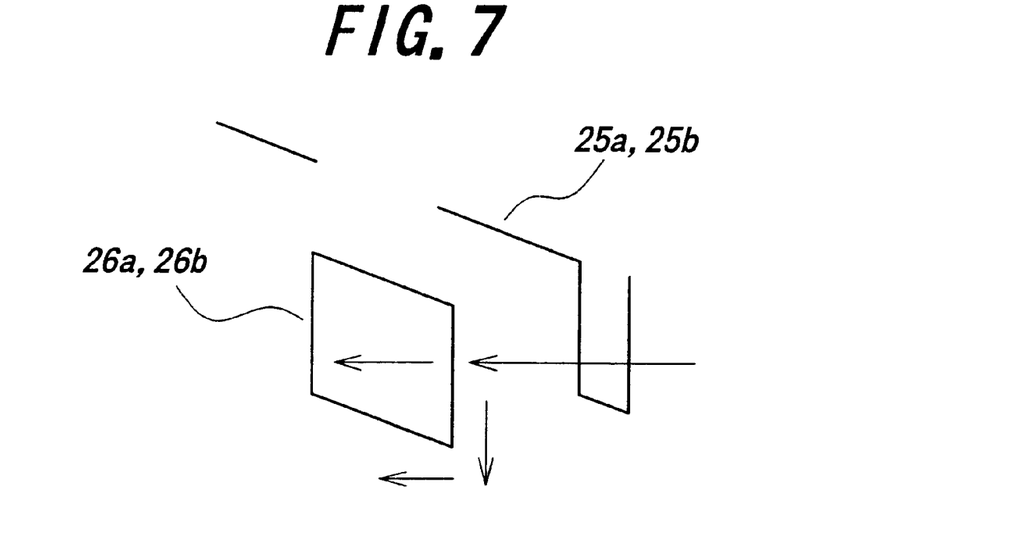
FIG. 7 is a schematic diagram showing the energy levels of a GaSb layer and an InAs layer.

The operation of the embodiment will be explained. As the top of a valence band of GaSb is higher in energy than the bottom of a conduction band of InAs, GaSb layers 25a, 25b and InAs layers 26a, 26b have a broken gap structure as shown in FIG. 7. As carriers or electrons injected into second subband within a quantum well of the GaSb layers 25a, 25b are blocked by a bandgap of the respective InAs layers 26a, 26b as represented by arrow, it is possible to prevent the leakage of the carriers. As a result of this, the leakage current of the element is reduced and the injection of the carriers with high efficiency is possible.

Figure 8:
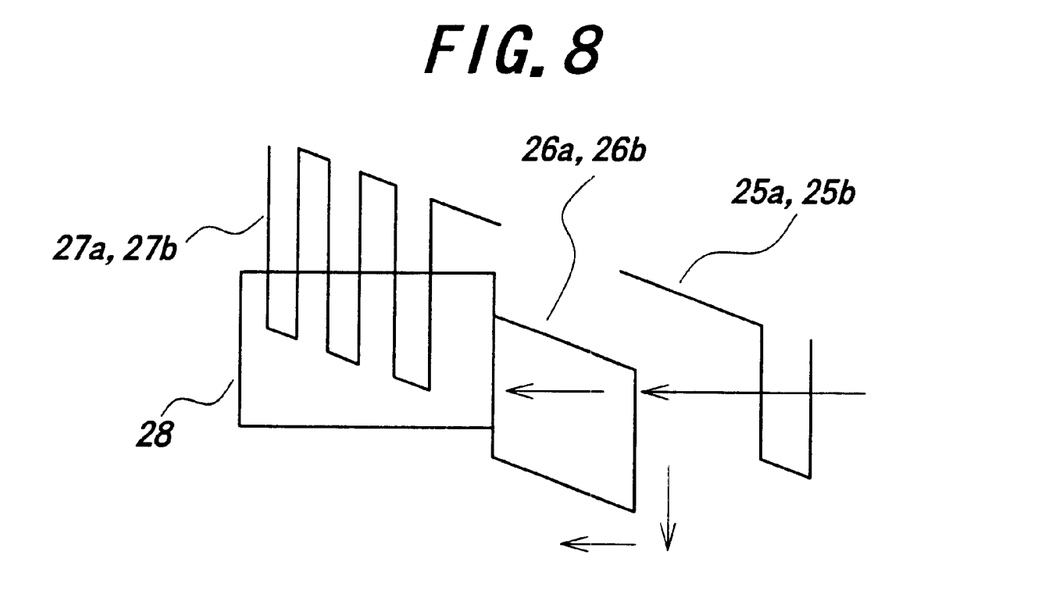
FIG. 8 is a schematic diagram showing the energy levels of a GaSb layer, an InAs layer and a GaSb/AlGaSb layer.

In the embodiment, as shown in FIG. 8, the leakage current is further reduced and the efficiency of the injection is improved because there is the GaSb/AlGaSb layer 27a, 27b with the superlattice which comprises a forbidden band 28.

Figure 9:
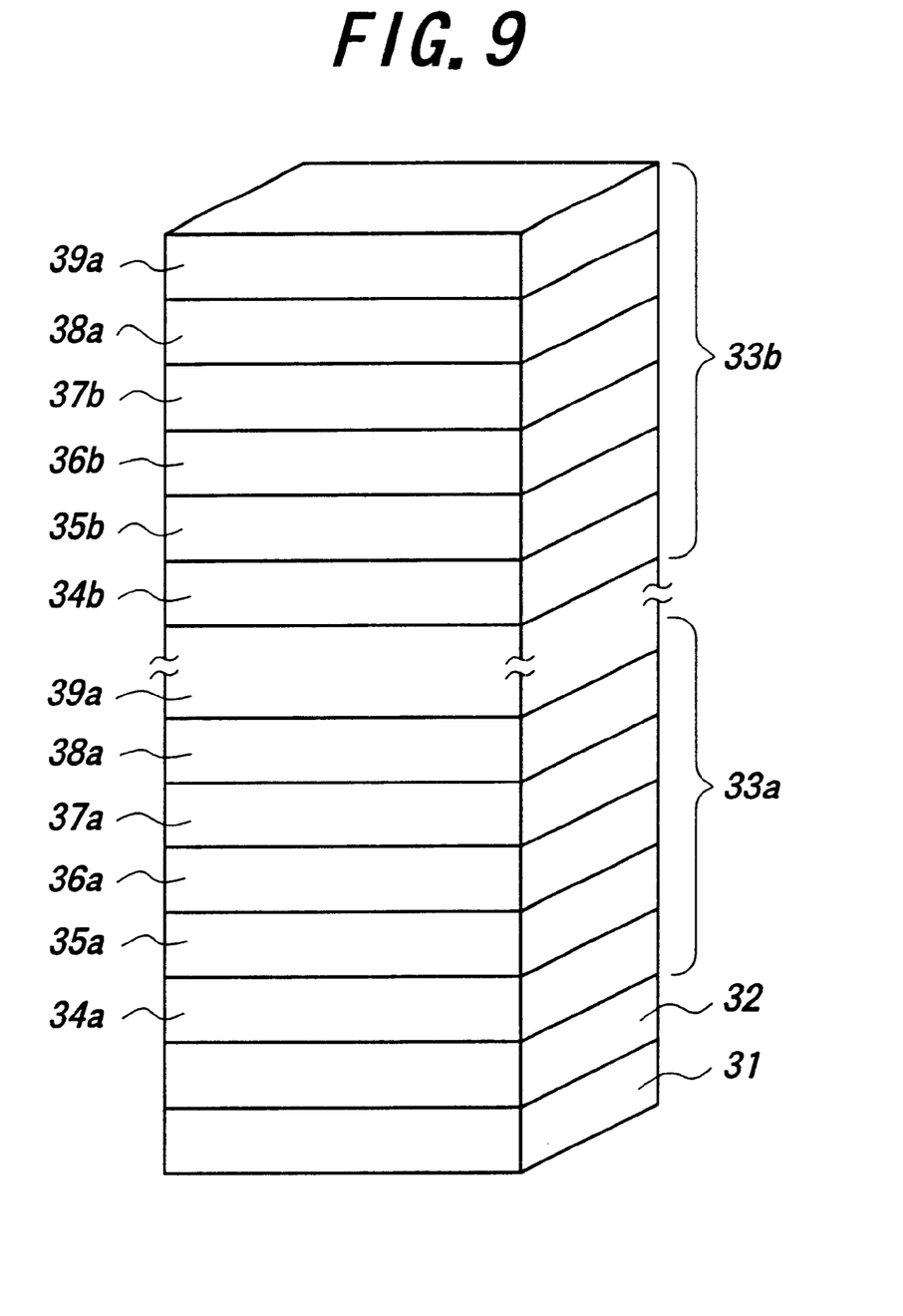
FIG. 9 is a schematic diagram showing a forth embodiment of the element according to the present invention.

FIG. 9 is a schematic diagram showing a forth embodiment of the element according to the present invention. The element performs an intersubband light emission at a valence band of itself and comprises a GaSb substrate 31, a GaSb/AlGaSb layer 32 provided on the GaSb substrate 31 and having a superlattice structure, and a plurality of layered portions 33a, 33b provided on the GaSb/AlGaSb layer 32 successively.

The layered portion 33a or 33b has an AlSb layer 34a or 34b, an GaSb layers 35a or 35b as the first layer, an AlGaSb layer 36a or 36b as the second layer making a heterojunction with the GaSb layer 35a or 35b, a GaSb layer 37a or 37b as the third layer making a heterojunction with the AlGaSb layer 36a or 36b, an InAs layer 38a or 38b as the forth layer making a heterojunction with the GaSb layer 37a or 37b, and a GaSb/AlGaSb layer 39a or 39b as the fifth layer having the superlattice structure.

The GaSb layers 35a, 35b, the AlGaSb layers 36a, 36b and the GaSb layers 37a, 37b form quantum wells (light emitting portion), respectively. A height of projecting potential barriers formed with the AlGaSb layer 36a is different from that formed with the AlGaSb layer 36b and thus it is possible to emit light having a plurality of wavelengths. The heights of the potential barriers can be changed by changing the composition of material of the layer forming the potential barrier, for example. In this case, the heights can be changed by changing the Al composition of the AlGaSb.

Figure 10A:
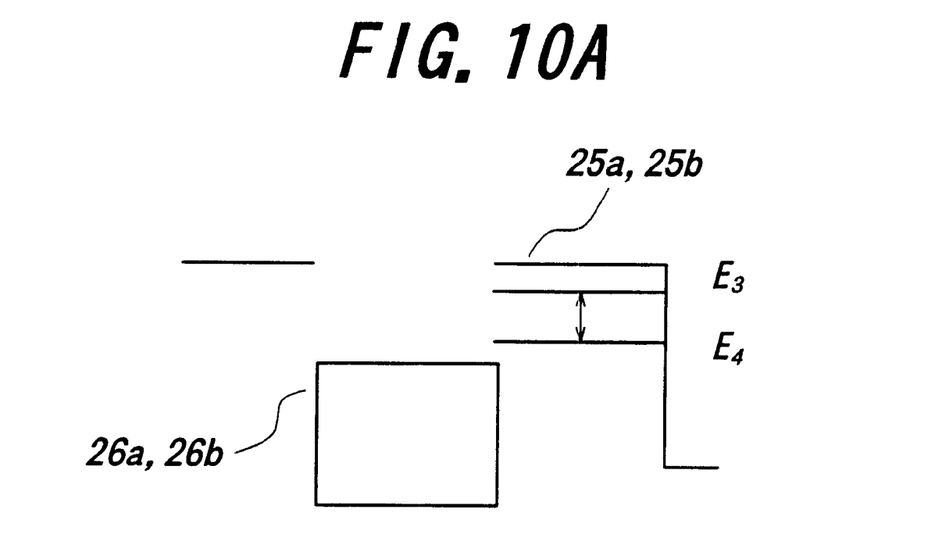
FIG. 10 is a schematic diagram showing the energy levels of a GaSb layer and an InAs layer as shown in FIG. 6.

The operation of the embodiment will be explained. The intersubband light emission occurs when the carriers injected into second subband $E_4$ within a quantum well are relaxed to first subband $E_3$. If a well width of a quantum well of the element having a InAs/GaSb/AlSb heterojunction structure as shown in FIG. 1 is widened to prolong the wavelength to the THz region, the second subband is higher in energy than the bottom of a conduction band of the InAs as shown in FIG. 10A. Therefore, the carriers injected into the second subband are not blocked by the barrier and thus the efficiency of the carrier injection is decreased.

Figure 10B:
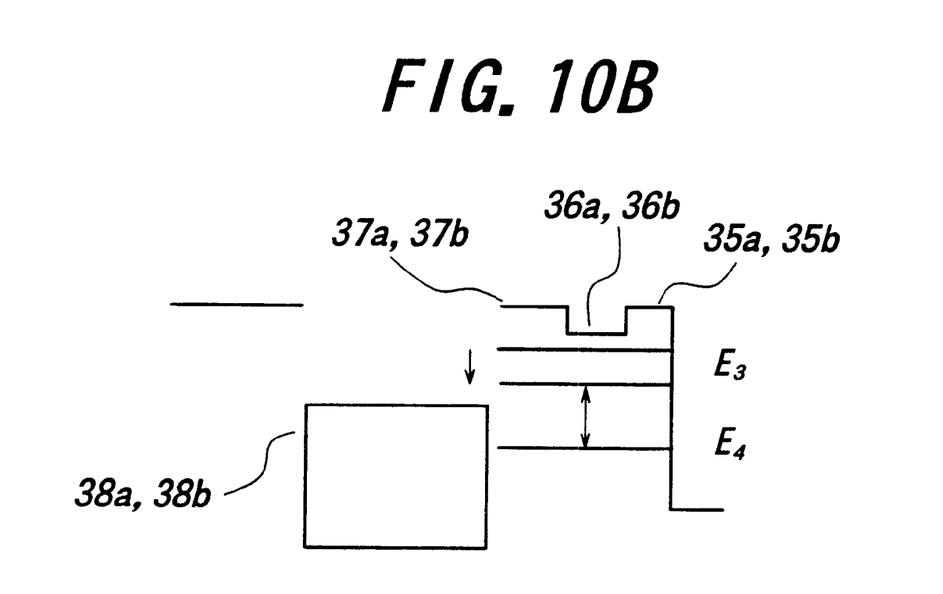

According to the embodiment, in order to prevent the decrease of the injection efficiency due to the prolongation of the wavelength of the light to the THz region, a projecting potential barrier is formed at the center of the quantum well by the AlGaSb having the top of a valence band higher in energy than the bottom of a conduction band of the InAs and lower in energy than the top valence band of the GaSb as shown in FIG. 10B. Such a projecting potential barrier has an effect on only the carrier distributed at the center of the quantum well. Accordingly, it is possible to increase the energy of the first subband without changing the energy of the second subband. Thereby, it is possible to decrease the energy space of the subband without affecting the injection efficiency of the carriers. As a result, it is possible to realize the element with a high efficiency even if the light having the wavelength of the THz region is emitted.

While the present invention has been described above with reference to certain preferred embodiments, it should be noted that it were presented by way of examples only and various changes and/or modifications may be made without departing from the scope of the invention. For example, it is possible to construct the element according to the present invention in combination the layered portions as shown in FIG. 1 and those as shown in FIG. 4. One of the layered portions as shown in one of FIGS. 1, 4, 6 and 9 can be provided on the substrate directly. A single layered portion as shown in FIGS. 1, 4, 6 and 9 can be used. The substrate can be composed of any other semiconducting material than the InAs and the GaSb. The layer having the superlattice structure can be composed of semiconducting material substantially lattice-matched to the substrate instead of InAs/AlSb. A layer of mixed crystal based on the InAs can be used instead of the InAs layer, and a layer of mixed crystal based on the GaSb can be used instead of the GaSb.

What is claimed is:

1. An intersubband light emitting element comprising:
   a semiconducting substrate;
   a first layer composed of a first semiconducting material;
   a second layer composed of a second semiconducting material and forming a heterojunction with said first layer, the top of a valence band of said second semiconducting material being higher in energy than the bottom of a conduction band of said first semiconducting material; and
   a third layer forming a heterojunction with one of said first and second layers and having a superlattice structure;
   wherein one of said first and second layer is provided on said semiconducting substrate directly or through at least one semiconducting layer; and
   wherein said intersubband light emitting element comprises a plurality of sets of said first and second layers, said sets each having a quantum well width of one of said first and second layers, said quantum well widths being different from each other among each of said sets.

2. The element according to claim 1, wherein said first semiconducting material is one of InAs and InAs with an impurity, said second semiconducting material is one of GaSb and GaSb with an impurity, and said superlattice structure is one of an InAs/AlSb superlattice structure, an InAs/AlSb superlattice structure with an impurity, a GaSb/AlGaSb superlattice structure, a GaSb/AlGaSb superlattice structure with an impurity, a GaSb/AlSb superlattice structure, and a GaSb/AlSb superlattice structure with an impurity.

3. An intersubband light emitting element comprising:
   a semiconducting substrate;
   a first layer composed of a first semiconducting material;
   a second layer composed of a second semiconducting material and forming a heterojunction with said second layer, the bottom of a conduction band of said second semiconducting material being higher in energy than that of said first semiconducting material;
   a third layer composed of a third semiconducting material which is the same as said first semiconducting material, and forming a heterojunction with said first layer; and
   a fourth layer composed of a fourth semiconducting material and forming a heterojunction with said third layer, the top of a valence band of said fourth semiconducting material being higher in energy than said the bottom of a conduction band of said second semiconducting material;
   wherein one of said first and fourth layers is provided on said semiconducting substrate directly or through at least one semiconducting layer.

4. The element according to claim 3, comprising a plurality of sets of said first to fourth layers, said sets each having a potential barrier of said second layer, heights of said potential barriers being different from each other among said sets.

5. The element according to claim 3, wherein each of said first and third semiconducting materials is one of InAs and InAs with impurity, and said second semiconducting material is one of AlInAs, AlInAs with impurity, GaInAs, GaInAs with impurity, InAsSb, and InAsSb with impurity.

6. The element according to claim 3, further comprising a fifth layer making a heterojunction with one of said first and fourth layer and having a superlattice structure.

7. The element according to claim 6, said superlattice structure is one of an InAs/AlSb superlattice structure, and an InAs/AlSb superlattice structure with impurity.

8. An intersubband light emitting element comprising:
   a semiconducting substrate;
   a first layer composed of a first semiconducting material;
   a second layer composed of a second semiconducting material and making a heterojunction with said second layer, the top of a valence band of said second semiconducting material being lower in energy than that of said first semiconducting material;
   a third layer composed of a third semiconducting material which is the same as said first semiconducting material, said third layer forming a heterojunction with said first layer; and
   a fourth layer composed of a fourth semiconducting material and making a heterojunction with said third layer, the bottom of a conduction band of said fourth semiconducting material being lower in energy than the top of a valence band of said second semiconducting material;
   wherein one of said first and fourth layers is provided on said semiconducting substrate directly or through at least one semiconducting layer.

9. The element according to claim 8, comprising a plurality of sets of said first to fourth layers, said sets each having a potential barrier of said second layer, said potential barriers having respective heights that are different from each other among each of said sets.

10. The element according to claim 8, wherein each of said first and third semiconducting materials is one of GaSb and GaSb with impurity, and said second semiconducting material is one of AlGaSb and AlGaSb with impurity.

11. The element according to claim 8, further comprising a fifth layer making a heterojunction with one of said first and fourth layer and having a superlattice structure.

12. The element according to claim 11, wherein said superlattice structure is one of a GaSb/AlGaSb superlattice structure, a GaSb/AlGaSb superlattice with impurity, a GaSb/AlSb superlattice structure, and a GaSb/AlSb superlattice structure with impurity.

* * * * *